United States Patent [19]

Ma

[11] 4,002,986

[45] Jan. 11, 1977

[54] TELEVISION RECEIVER WITH TUNER CAPABLE OF RECEIVING AIR AND CATV SIGNALS

[75] Inventor: John Y. Ma, Glenview, Ill.

[73] Assignee: Zenith Radio Corporation, Chicago, Ill.

[22] Filed: Mar. 27, 1975

[21] Appl. No.: 562,534

[52] U.S. Cl. .............................. 325/459; 325/465; 178/DIG. 15
[51] Int. Cl.² .......................................... H04B 1/16
[58] Field of Search ............... 334/14, 15; 325/308, 325/458, 459, 462, 465

[56] References Cited

UNITED STATES PATENTS

| | | | |
|---|---|---|---|
| 3,544,903 | 12/1970 | Sakamoto | 325/459 |
| 3,646,450 | 2/1972 | Ma | 325/458 |

OTHER PUBLICATIONS

Anderson, Details of the New RCA Cable Receivers, Electronic Servicing, Oct., 1973, p. 18.

Primary Examiner—Richard Murray
Attorney, Agent, or Firm—Nicholas A. Camasto

[57] ABSTRACT

A television receiver having a varactor diode tuned VHF tuner is operable with airborne and cable-connected signals. Bandswitch-controlled diodes change the values of inductive reactance in the tuner stages so the varactor diodes can tune to signals in the VHF Lo and Hi bands and CATV Mid and Super bands. Automatic bandswitching circuitry is included to enable reception of VHF channels 2-13 and UHF channels when operating in the air signal mode and VHF channels 2-13 and CATV Mid (A—I) and Super band (J—Z) channels when operating in the cable signal mode.

16 Claims, 7 Drawing Figures

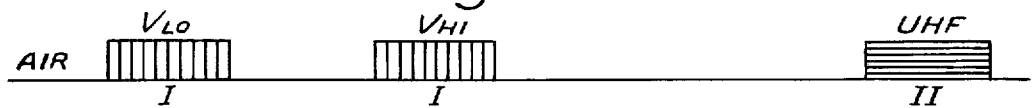
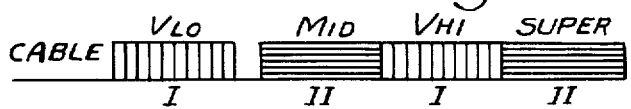
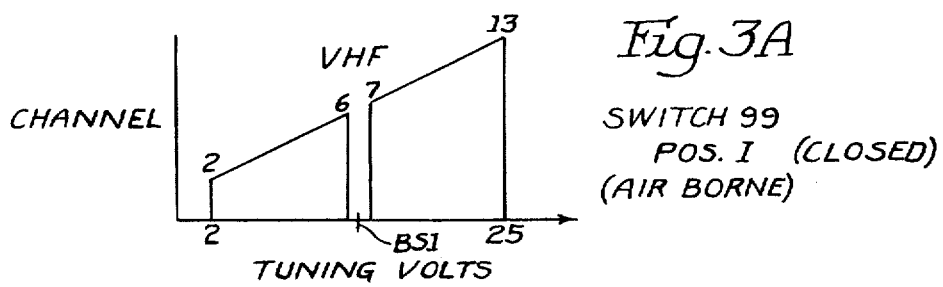
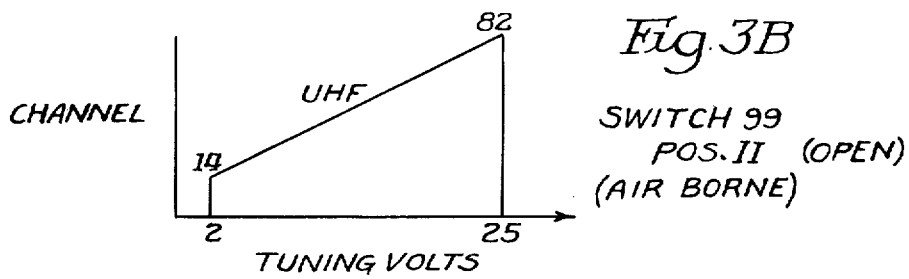
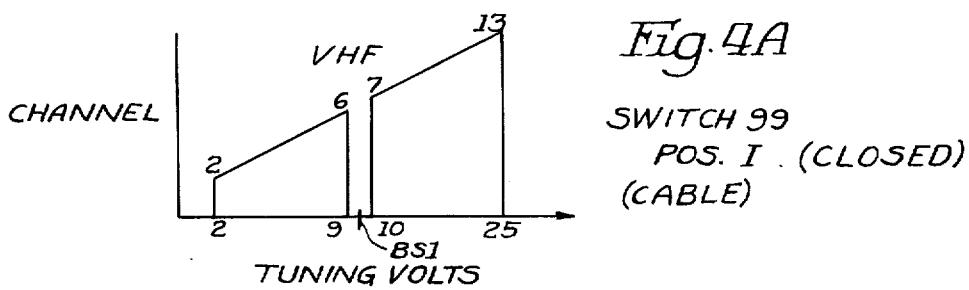
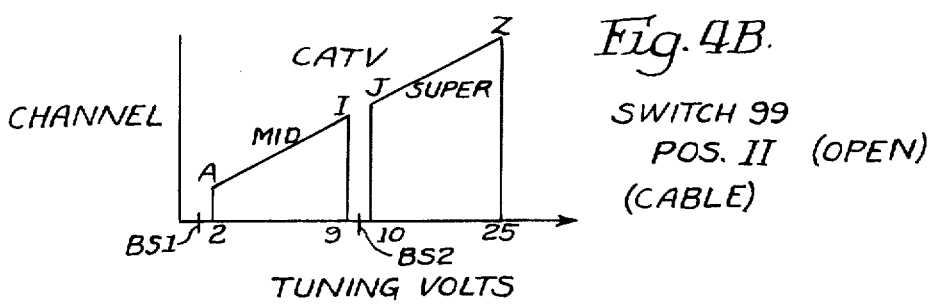

TELEVISION RECEIVER WITH TUNER CAPABLE OF RECEIVING AIR AND CATV SIGNALS

BACKGROUND OF THE INVENTION

This invention relates to television receivers suitable for reception of both airborne and cable-connected (wired) television signals in the very high frequency (VHF) region and airborne television signals in the ultra high frequency (UHF) region.

As is well known, airborne television signals comprise a VHF or UHF picture carrier modulated with synchronizing and video information components and an accompanying-displaced, FM modulated, audio carrier. The allotted bandwidths for the television signals (commonly referred to as channels) are 6 MHz.

In addition to airborne signals, there is a growing interest in conveying television signals to viewers' homes over cable or wired systems. Cable antenna television systems (CATV) exhibit a number of reception advantages for certain areas and also can greatly increase the amount and type of program material available for viewing. CATV transmitters are also subject to the restrictions of over-the-air transmitters and are licensed to operate on assigned frequencies in the VHF region.

In general, a receiver will either be used with airborne signals or with cable signals. Therefore, cable systems are required by law to provide their subscribers with all local airborne signals as well as other program material. Thus a cable system in an area receiving channels 2, 5, 7 and 9, for example, would supply these signals to its cable subscribers along with other cable signals. As will be seen, this poses a significant burden on the television receiver tuning system.

Television tuners have changed over the years from somewhat cumbersome mechanical devices to relatively simple no-moving-part structures, primarily due to the use of varactor diodes in their tuned circuits. A varactor diode exhibits a capacity which varies as a function of the DC potential applied across its terminals and varactor diode tuners are readily controllable by application of a simple DC (tuning) voltage to the varactor diodes providing the capacitance for the various tuner stages. The magnitude of diode capacitance is a function of the diode junction area, the applied DC potential and type of doping used in fabricating the diode junction. Varactor diode tuners have been widely available for a number of years, have proven quite satisfactory in operation, and are rapidly displacing mechanical tuners in television receiver design.

While varactor diodes exhibit capacity changes for DC voltage changes of very small magnitude, tuning voltages below 0.5 volt DC are considered unusable in television tuners, because the signal levels in the tuner are often large enough to produce noticeable changes in such low tuning voltages, with consequent signal distortions. At the other extreme, the internal resistance of the varactor diode increases for higher rated breakdown voltages. Thus, while greater capacitance-voltage range may be attained by using diodes of higher voltage breakdown and increasing the tuning voltage, the diode internal resistance limits the gain achievable in the tuner at the high frequency channels, and is, therefore, self-defeating. This factor effectively imposes an upper limit on the tuning voltage of about 25 volts. Therefore, the usable tuning voltage range for the varactor diode is between 0.5 and 25 volts.

The wide frequency range encompassing the television signal spectrum has dictated use of separate VHF and UHF tuners. Additionally, the VHF frequency spectrum alone spans such a large frequency range that bandswitches for changing the value of the inductive reactances in the tuned circuits are needed, because the varactor diodes exhibit insufficient capacitance changes. Bandswitching, as distinct from switching to a different tuner, involves changing the values of one of the reactive components in the tuned circuit to enable the same value opposite sign reactance component to tune the circuit to a different resonance point.

The VHF television spectrum or range embraces three distinct bands of frequencies. The first band is from 57 MHz to 69 MHz (channels 2–4), the second band is from 79 MHz to 85 MHz (channels 5 and 6) and the third band is from 177 MHz to 213 MHz (channels 7–13). Each television channel occupies 6 MHz and the above limits are measured from the center frequencies of the channels. In practice the VHF spectrum is divided into two frequency sections, the "Lo" band comprising the above-mentioned first and second bands (channels 2–6) and the "Hi" band comprising the third band (channels 7–13). The UHF allocated channels (14–82) cover the frequency range of 460–910 MHz.

The CATV allocated channels are in a so-called "Mid" band consisting of channels A–I (123 MHz to 171 MHz) and a so-called "Super" band consisting of channels J–Z (219 MHz to 315 MHz). Recently, these letter-designated channels have also been given numerical designations with channels A–I being channels 83–91 and channels J–Q being channels 92–99. (Channel A has been abandoned and it is almost certain that channels R–Z will be reallocated.)

Prior art solutions to the problem of supplying television receivers capable of receiving VHF and UHF, and CATV channels have been very limited. All incorporate a converter of some sort for accepting cable television signals, converting them to a common IF frequency, generally that corresponding to the frequency of VHF channel 4, and applying them to a selected channel position on a conventional VHF tuner. The arrangement is similar to that used with continuous type UHF tuners which function when the VHF tuner is in a selected channel position. The major difference between the prior art solutions is the location of the converter. In some it is incorporated within the tuner housing and in others it is an "add-on" or attachment. These systems are very expensive and cumbersome, require some form of high frequency switching and, of course, incorporate an additional component.

On the contrary the system of the invention incorporates a conventional VHF tuner, modified to include an additional set of switching diodes for changing inductance values, enabling it to tune all airborne signals in the regular mode and cable-connected conventional airborne VHF channels and all additional CATV channels in the Mid and Super bands. Mode selection is accomplished by plugging either the antenna or cable connector to the tuner and moving a simple low frequency (DC) switch to the appropriate position (cable or air).

SUMMARY OF THE INVENTION

A television receiver capable of receiving both airborne and cable television signals, lying in three or more frequency bands, includes a VHF tuner having a plurality of varactor diode tunable stages each including an inductive reactance, the varactor diodes exhibiting a capacitance range variation as a function of applied tuning voltage which is insufficient to enable said tuner to receive all of said television signals. Means are provided for coupling said television signals to said tuner without frequency conversion. Bandswitch means are included for adjusting the values of said inductive reactances to permit tuning to more than one of said television signals lying in different ones of the frequency bands with substantially the same magnitude of tuning voltage.

OBJECTS OF THE INVENTION

A principal object of this invention is to provide a novel television receiver.

Another object of this invention is to provide a novel television receiver operable with either cable-connected or airborne signals.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIGS. 2A and 2B are idealized plots of the frequency ranges tunable by the television receiver of the invention when operating on airborne and cable-connected signals, respectively;

FIGS. 3A and 3B are idealized tuning voltage curves indicating the channels receivable when in the airborne mode; and FIGS. 4A and 4B are similar plots of the channels receivable vs. tuning voltage when in the cable mode.

DESCRIPTION OF THE PREFERRED EMBODIMENT

Figure 1:
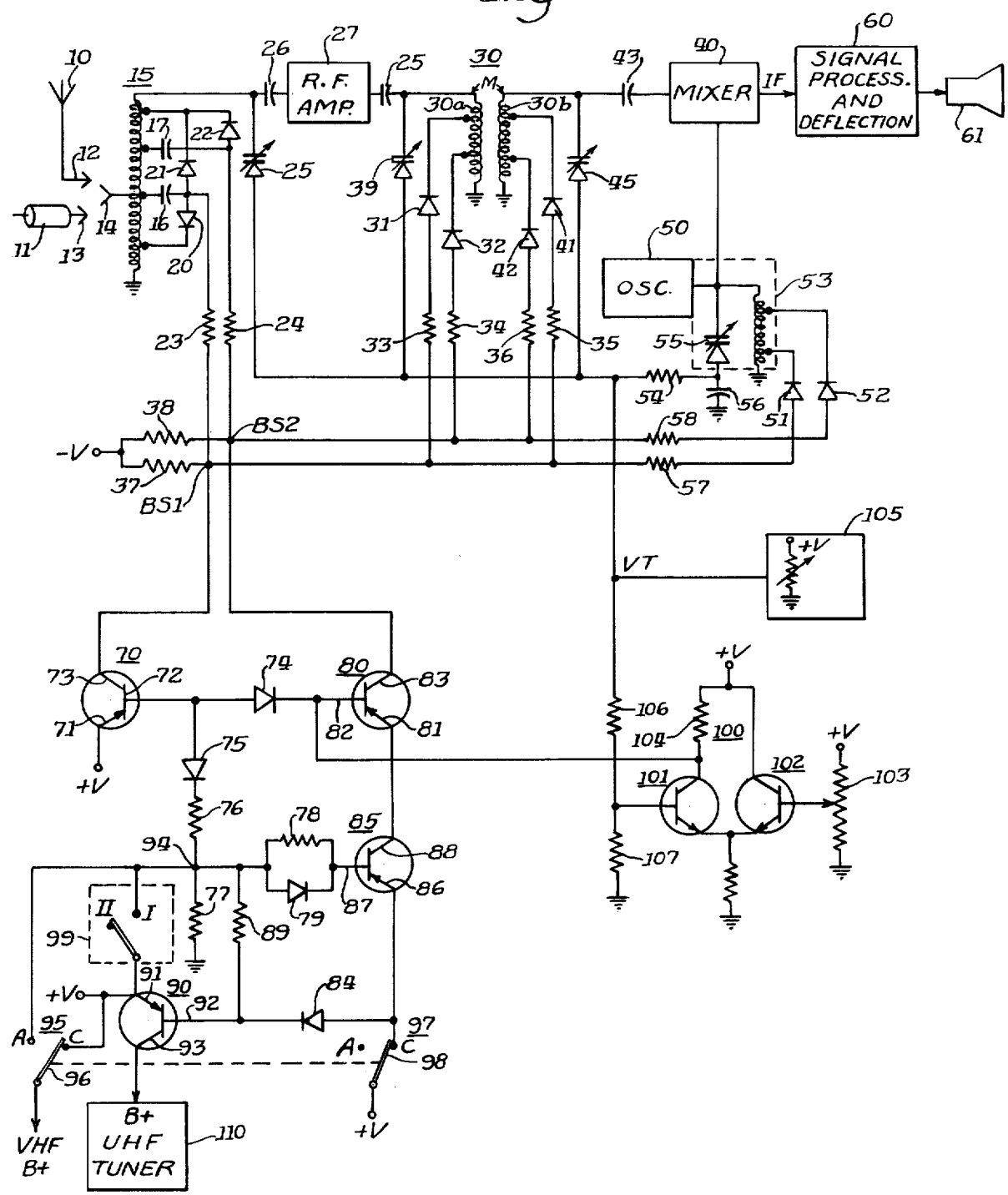
FIG. 1 is a partial block, partial schematic diagram of a television receiver constructed in accordance with the invention.

Referring to FIG. 1, a television receiver includes an antenna 10 and a cable input 11 terminating in connector plugs 12 and 13, respectively. A connector socket 14 is capable of mating engagement with either of connector plugs 12 or 13 for connecting the television receiver to a source of airborne signals via antenna 10, or to a source of cable-connected signals via cable 11. It should be understood that either antenna 10 or cable 11 is connected to the receiver, but not both. The antenna input circuit comprises a transformer 15 having a plurality of taps. A DC blocking capacitor 16 is coupled to a tap on transformer 15 and to the junction of the anodes of a pair of switching diodes 20 and 21, the cathodes of which are connected to other taps on the transformer. Another portion of transformer 15 is connected between a blocking capacitor 17 and the cathode of a switching diode 22. The anodes of switching diodes 20 and 21 are connected through a resistor 23 to a junction labelled BS1 (Bandswitch No. 1). The anode of switching diode 22 is connected through a resisitor 24 to a junction labelled BS2 (Bandswitch No. 2). The antenna input circuit is completed through a varactor tuning diode 25 which is connected to a junction labelled VT (Tuning Voltage).

The output of the antenna circuit is coupled through a capacitor 26 to an RF amplifier 27 whose output is, in turn, coupled through a capacitor 28 to the primary winding 30a of an interstage transformer 30. The primary of the interstage transformer is tuned by a varactor diode 39 which is returned to the tuning voltage junction VT and has a pair of taps to which the cathodes of switching diodes 31 and 32 are respectively connected. These diodes are returned through resistors 33 and 34 to junctions BS1 and BS2, respectively. The secondary winding 30b is similarly arranged with a varactor tuning diode 45, switching diodes 41 and 42 and resistors 35 and 36. The primary and secondary windings are coupled by the mutual inductance between them, indicated by the letter M. The output of the interstage network is coupled through a capacitor 43 to a mixer 40.

An oscillator 50 supplies a signal to the mixer where, in a well known manner, the amplified RF signal is heterodyned to produce a fixed frequency intermediate frequency (IF) signal. The oscillator frequency is controlled by a varactor diode 55 (in its tank circuit) which is returned to ground through a DC blocking capacitor 56. Tuning voltage is supplied from junction VT through a resistor 54 to varactor diode 55. The resistor is included to adjust the level of the tuning voltage for the oscillator to provide tracking with the other varactor diodes. The tank circuit for the oscillator is shown enclosed in dashed lines and includes in addition to varactor diode 55, an inductance 53 having a pair of taps to which are connected the cathodes of a pair of switching diodes 51 and 52. The diodes are connected to junctions BS1 and BS2 through resistors 57 and 58, respectively.

Tuning voltage for the varactor diodes is supplied to junction VT from a block 105. A potentiometer coupled between +V and ground is shown in block 105 as an example only. While the tuning voltage may be any source of variable direct current, it preferably comprises a plurality of individually selectable DC voltages which correspond to desired television channels. To that end a switching arrangement of conventional design may be used for changing receiver tuning.

It is common practice in electronic tuners to provide a plurality of tuning locations on a receiver at which any of a plurality of television signals may be received. Such arrangements are varied convenient in that the viewer need only "program" the receiver to receive the channels of his preference and thereby avoid tuning through unused channel positions — as occurs with conventional detent-type tuners. Further, as will be explained, the tuning locations may incorporate combination channel-indicating and bandswitch-operating tabs similar to those described in U.S. Pat. No. 3,835,395 issued Sept. 10, 1974 in the name of Dennis Smith entitled TELEVISION CHANNEL INDICATING TAB WITH AUTOMATIC VHF/UHF SWITCHING.

Junctions BS1 and BS2 are connected to a source of negative voltage −V through a pair of resistors 37 and 38, respectively. In practice −V equals −9 volts and provides back bias for the switching diodes.

The IF signal output from mixer 40 is supplied to a block 60 containing signal processing and deflecting circuitry for the television receiver. Block 60 is shown coupled to a cathode ray tube 61 which completes the television receiver. It will be noted that the power supply apparatus has been excluded to simplify the arrangement. As with the channel selector arangement, it will be appreciated that any of a number of conventional type power supplies may be incorporated.

With the exception of the alternate antenna and cable inputs, and the switch diodes, isolating resistors, blocking capacitors and corresponding inductance taps associated with the second bandswitch, the television receiver is essentially conventional.

A first bandswitch transistor 70 includes an emitter 71 connected to a positive source of potential +V, a base 72 and a collector 73, coupled to junction BS1. A second bandswitch transistor 80 includes an emitter 81, a base 82 and a collector 83, connected to terminal BS2. A diode 74 interconnects the bases of the two transistors. Base 72 is connected to ground through a diode 75 and the series combination of a pair of resistors 76 and 77. The junction of these two resistors, labelled 94, is connected to a terminal I of a switch indicated by dashed line block 26 and a terminal A (air) of a switch 95. A switch transistor 85 includes an emitter 86, a base 87 and a collector 88, which is connected to emitter 81 of second bandswitch transistor 80. Junction 94 of resistors 76 and 77 is further connected to base 87 of transistor 85 through the parallel combination of a resistor 78 and a diode 79. A UHF B+ switch transistor 90 includes an emitter 91, a base 92 and a collector 93. Emitter 91 is connected to +V and to the movable member of the switch in block 99. Base 92 is connected to junction 94 through a resistor 89 and to the emitter of transistor 85 through a diode 84. Collector 93 supplies B+ to a UHF tuner indicated by a block 110.

Switch 95 includes a second terminal C (cable) which is connected to +V. Element 96 of switch 95 is indicated as supplying VHF B+. A switch 97 includes an element 98 operable in conjunction with element 96 of switch 95, as indicated by the interconnecting dashed line, and is connected between emitter 86 of transistor 85 and +V.

A level setting circuit for determining the bandswitching voltage point includes a pair of differentially connected transistors 101 and 102 with the input to the base of transistor 102 being provided by a movable tap on a potentiometer 103 connected between +V and ground. The input to the base of transistor 101 is supplied from the junction of a pair of resistors 106 and 107 connected between terminal VT and ground. The output of the level setter is taken from load resistor 104 in the collector circuit of transistor 101 supplied to the base of bandswitch transistor 80. The tuning voltage at which transistors 101 and 102 change states is determined by the setting of the potentiometer 103.

OPERATION

As previously indicated the receiver is operable in either an airborne signal mode or a cable-connected signal mode. Assume that the airborne mode is selected. Connector plug 12 on antenna 10 is connected to connector socket 14 and switches 95 and 97 are in their A positions. For a channel in the VHF Lo band (channels 2–6), switch 99 is in position I. Assume further that the automatic switch voltage for the first bandswitch is 9½ volts. (It is known in the art to provide an automatic bandswitch between VHF channels 6 and 7.) For channels 2–6, the tuning voltage is less than 9 ½ volts and VT is therefore less than 9 ½ volts. Transistor 102 in level setter 100 is in conduction and transistor 101 is cut off. Its collector is at +V volts which places the base of the second bandswitch transistor 80 at +V volts. Thus transistor 80 is cut off. +V through switch 99 places junction 94 of resistors 76 and 77 at a high potential. This positive potential on emitter 91 on UHF B+ switch 90 is ineffective because of the positive voltage on its base 92 (applied through resistor 89). The positive potential at junction 94 places base 72 of transistor 70 at +V volts also and since its emitter is at +V, transistor 70 is non-conductive. Therefore, both terminals BS1 and BS2 continue to be at a negative voltage. Accordingly, none of the switching diodes are activated and the VHF tuner is in the VHF Lo band tuning condition.

Assume that a VHF Hi band channel (7–13) is selected and therefore that the tuning voltage is greater than 10 volts. Level setter 100 switches, with transistor 102 becoming non-conductive and transisitor 101 going into saturation. Its collector potential drops placing the base of transistor 80 at this low potential as well as the base of transistor 70 (through diode 74). Transistor 70 is driven into conduction. (As will be shown, second bandswitch transistor 80 is not driven conductive because of its dependence upon transistor 85.) Its collector potential goes positive and overcomes the negative bias applied to terminal BS1. Switching diodes 20 and 21 are driven conductive and effectively short out a portion of antenna transformer 15, changing the inductive reactance of the antenna input circuit. Similarly, diodes 31 and 41 in the interstage network are switched as is diode 51 in the oscillator. Thus, the tuner is automatically switched to its VHF Hi band tuning condition.

For signals in the UHF region, switch 96 is opened (placed in its II position) which breaks the +V connection to the VHF tuner. The +V potential at junction 94 is therefore removed and transistor 90 is allowed to conduct along a path including +V, emitter 91, base 92, resistor 89 and resistor 77. Thus, UHF tuner 110 is supplied +V through collector 93. While the base of transistor 85 is at a lowered positive potential, the transistor is not in conduction because its emitter is at this same lowered potential. Consequently, transistor 80 is maintained non-conductive and terminal BS2 is maintained at a negative potential.

As is conventional practice with UHF tuners, the VHF tuner is operated as an IF amplifier for the signals from the UHF tuner. Consequently, while not shown, a portion of the VHF tuner is continuously energized. When in the UHF mode, first bandswitch transistor 70 is maintained conductive to override the negative bias on junction BS1 and switch the appropriate diodes to preclude interference problems at low UHF tuning voltages. This operational aspect is not relevant to the claimed invention.

When operating in the cable mode, connector plug 13 on cable 11 is connected to connector socket 14 and switches 95 and 97 are placed in their cable (C contact) positions. It will be recalled that CATV operators are required to supply their cable subscribers with all locally available airborne VHF channels. For channels 2–6, switch 99 is in position I. Transistor 102 of level setter 100 is conductive and transistor 101 is cut off. Transistor 80 is non-conductive since +V is supplied to its base from the collector of transistor 101. Junction 94 is at +V (through switch 99) and transistor 70 is therefore cut off. B+ to the VHF tuner is permanently supplied through the C contact of switch 95. With switch 97 in the CATV position (C contact), +V is supplied to base 92 of transistor 90 through diode 84 and to emitter 86 of transistor 85. Because junction 94 is also at +V, transistor 85 is cut off. The +V on the base of transistor 90 precludes UHF tuner 110 from being energized when the television receiver is operated in the CATV mode. The tuner is thus in the VHF Lo band condition.

For VHF Hi band channels 7–13, transistor 101 is in conduction, placing base 72 of transistor 70 at a low positive potential and causing transistor 70 to conduct. Thus, the diodes connected to terminal BS1 are switched. Switch 99 remains in position I and transistors 85 and 90 are cut off. Switching of the diodes connected to terminal BS1 places the VHF tuner in its VHF Hi band condition.

For all CATV letters channels A–I (Mid band) and J–Z (Super band), switch 99 is in position II, which removes +V from junction 94 and enables transistor 85 to conduct. For tuning voltages under 9 ½ volts, transistor 101 in level setter 100 is non-conductive and the +V potential at its collector maintains transistor 80 in cutoff despite the conduction of transistor 85. However, since junction 94 is at a lower positive potential (+V, through resistors 89 and 77 to ground), transistor 70 conducts and the tuner operates in its VHF Hi band condition which, as will be seen, enables it to tune to the CATV Mid band channels.

For tuning voltages in excess of 9 ½ volts, level setter transistor 101 is conductive, reducing the voltage on base 82 and enabling second bandswitch transistor 80 to conduct in series with transistor 85. When transistor 80 conducts, the potential at terminal BS2 is sufficient to override the normal negative bias and switch diodes 22, 32, 42 and 52, placing the VHF tuner in the Super band condition.

In FIG. 2A there is a graph representing the receivable television frequency spectrum when the receiver of the invention is operating in the airborne mode. The vertically lined areas identified as V Lo and V Hi represent channels 2–6 in the VHF Lo band and 7–13 in the VHF Hi band and the horizontally lined area labelled UHF represents television channels 14–82 in the UHF band. The I under the V Lo and V Hi areas and the II under the UHF area indicate the positions of switch 99 in FIG. 1. The areas in the graph are not drawn to scale and it will be understood that the depictions in this and other figures are idealized for illustration purposes.

FIG. 2B is a similar showing of the television signals receivable when operating in the cable mode. The vertically lined areas (V Lo and V Hi) correspond to the similarly marked areas in FIG. 2A. The horizontally lined areas are labelled Mid and Super and are on adjacent sides of the V Hi area. As indicated, the V Lo and V Hi bands are receivable when switch 99 is in position I and the Mid and Super bands are receivable when switch 99 is in position II.

FIGS. 3A, 3B, 4A and 4B are idealized not-to-scale representations of the channels receivable as a function of tuning voltage. FIG. 3A represents conditions when the receiver is operated in the airborne mode with switch 99 being in position I. VHF channels 2–6 are indicated as being receivable in a tuning voltage range extending from approximately 2–9 volts. VHF channels 7–13 are receivable in a tuning voltage range extending from 10–25 volts. The first bandswitch I is automatically operated in the gap between VHF channels 6 and 7 (corresponding to tuning voltages of 9 and 10, respectively) to bridge the large frequency spread between channels 6 and 7 by changing the inductances in the tuned circuits of the tuner. This is indicated by the legend BS1 at the 9 ½ volt point.

FIG. 3B represents conditions when the receiver is operating in the airborne mode with switch 99 in position II. As shown, UHF channels 14–82 are tunable with tuning voltages extending from 2–25 volts. No bandswitching is required in the UHF region.

FIG. 4A represents conditions when the receiver is operating in the cable mode with switch 99 again in position I. FIG. 4A is identical to FIG. 3A indicating that all regular VHF channels 2–13 are receivable. Note that the first bandswitch is operative at 9 ½ volts.

FIG. 4B represents conditions when the receiver is operating in the cable mode with switch 99 in position II and here channels A–I, corresponding to the CATV Mid band, are receivable with tuning voltages of 2–9 volts and channels J–Z, corresponding to the CATV Super band, arre receivable with tuning voltages of 10–25 volts. Note that the first bandswitch is indicated by BS1 at less than 2 volts as operated over the entire tuning voltage range and that the second bandswitch is indicated as operated by BS2 at 9 ½ volts.

In practice, the bandswitching voltage point may differ from the 9 ½ volts used herein. (This accounts for the inclusion of potentiometer 103 in level setter 100.) It may be that the tuner design may dictate a higher or lower bandswitch voltage. Suffice it to say that the bandswitching voltage is the same for both bandswitches.

In practice, switches 95 and 97 are part of a double-pole, double-throw switch located adjacent to the antenna/cable input connectors on the back of the receiver. For any given installation, the switch is set to either the air or cable position (as is also true for the antenna cable input connection). Switch 99 may conveniently take the form described and claimed in U.S. Pat. No. 3,835,395 of a channel number indicating tab with position II being defined by a tab without an aperture (open circuit) and position I being defined by a tab with an aperture (closed circuit). Thus as taught in the above-mentioned patent, channel tabs bearing the numbers 2–13 would include an aperture for placing switch 99 in position I and all UHF channels and all CATV letter channels (Mid and Super bands) would not have an aperture, thus placing switch 99 in position II.

It is, of course, feasible and within the purview of this invention to use multiple aperture tabs in conjunction with simple combinational logic circuitry to derive bandswitching and B+ switching for the tuner. With such an arrangement switches 95, 97 and 99 may be replaced by a two switch arrangement operated by channel indicating tabs having a coded arrangement of a pair of apertures for determining the various switch positions as a function of channel designation. However, the described embodiment is the most economical and the additional switches do not present any substantial inconvenience to the user.

It should be noted that contrary to prior art tuners, the tuner of the invention does not require any frequency conversion apparatus to enable it to function with either airborne or cable television signals.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A television receiver for receiving, with a single tuner, both airborne and cable television signals lying in three or more frequency bands comprising: a tuner having tunable stages each including an inductive reactance and a varactor diode exhibiting capacitance variations as a function of applied DC tuning voltage, the range of capacitance variation being insufficient, in conjunction with said inductive reactance, to enable said tuner to receive all of said television signals; means for coupling said television signals to said tuner without frequency conversion; and bandswitch means in said television receiver for adjusting the values of said inductive reactances in said tunable stages for television signals lying in different ones of said frequency bands to permit substantially the same magnitude tuning voltage to tune to more than one of said television signals.

2. A television receiver as set forth in claim 1, wherein said bandswitch means comprise a first bandswitch for enabling said tuner to tune television signals in the CATV Mid band and a second bandswitch for enabling said tuner to tune television signals in the CATV Super band.

3. A television receiver as set forth in claim 2, wherein said bandswitch means include switching diodes coupled to said inductive reactances.

4. A television receiver as set forth in claim 3, wherein said television receiver includes mode selection means for selectively enabling said tuner to receive said cable and airborne television signals.

5. A television receiver as set forth in claim 4, further including an antenna and a CATV cable input each terminating in first and second connectors, respectively, and wherein said mode selection means comprise a mating connector coupled to said tuner input and adapted to selectively receive said first and second connectors in mechanical and electrical engagement.

6. A television receiver as set forth in claim 5, wherein said mode selection means further include a switch having an air and a cable position; said first bandswitch being operated to adjust said tuner to receive television signals in the CATV Mid band in response to said switch being in the cable position.

7. A television receiver as set forth in claim 6, wherein said bandswitch means automatically operates said second bandswitch for changing the value of said inductive reactances as a function of the magnitude of said tuning voltage to tune to signals in the CATV Super band when said switch is in said cable position.

8. A television receiver as set forth in claim 7, wherein said bandswitch means automatically operate said first bandswitch to adjust said tuner to tune to signals to the VHF Hi band as a function of the magnitude of said tuning voltage when said switch is in said air position.

9. A television receiver as set forth in claim 8, wherein said tuning voltage range extends from approximately 2 volts to 25 volts, and said magnitude of tuning voltage for operating said bandswitches is approximately 9 ½ volts.

10. A television receiver as set forth in claim 2, wherein said television receiver is selectively operable in either a cable mode or an airborne signal mode and wherein said tuner normally tunes to the VHF Lo band; said bandswitching means operating said first bandswitch to enable said tuner to tune to the VHF Hi band when in said airborne signal mode as well as to said CATV Mid band when in said cable mode.

11. A television receiver as set forth in claim 10, wherein said bandswitching means operates said second bandswitch to enable said tuner to tune to the CATV Super band when in said cable mode.

12. A television receiver as set forth in claim 11, wherein said bandswitching means operates said first bandswitch automatically when the tuning voltage reaches a predetermined level.

13. A television receiver as set forth in claim 12, wherein said bandswitching means operates said second bandswitch automatically at the same predetermined level of tuning voltage.

14. A television receiver for selectively receiving, with a single tuner, airborne television signals in the VHF Lo and Hi bands when operating in a first mode and television signals in the VHF Lo, Hi and CATV Mid and Super bands when operating in a second mode comprising: a tuner having tunable stages each including an inductive reactance and a varactor diode exhibiting capacitance variations as a function of applied DC tuning voltage, the range of capacitance variation being insufficient, in conjunction with said inductive reactance, to enable said tuner to receive all of said television signals when in either of said modes; the values of said inductive reactances rendering said tuner normally tunable to signals in said VHF Lo band; means for coupling said television signals to said tuner without frequency conversion; a first bandswitch for adjusting the values of said inductive reactances for enabling said tuner to tune television signals in said VHF Hi band and cable signals in said CATV Mid band; and a second bandswitch for enabling said tuner to tune television signals in said CATV Super band.

15. A television receiver as set forth in claim 14, further including a mode selection switch defining said first and second modes, said first bandswitch being operated to enable said tuner to receive television signals in said CATV Mid band in response to said switch defining said second mode.

16. A television receiver as set forth in claim 15, wherein said bandswitches include biased diodes which are automatically switched for changing the valves of said inductive reactances as a function of the magnitude of said tuning voltage.

* * * * *